United States Patent
Hector et al.

(10) Patent No.: US 6,835,671 B2
(45) Date of Patent: Dec. 28, 2004

(54) METHOD OF MAKING AN INTEGRATED CIRCUIT USING AN EUV MASK FORMED BY ATOMIC LAYER DEPOSITION

(75) Inventors: Scott Daniel Hector, Austin, TX (US); Bich-Yen Nguyen, Austin, TX (US); Dina H. Triyoso, Houston, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 44 days.

(21) Appl. No.: 10/222,505

(22) Filed: Aug. 16, 2002

(65) Prior Publication Data

US 2004/0033699 A1 Feb. 19, 2004

(51) Int. Cl.$^7$ .............................................. H01L 21/461
(52) U.S. Cl. ....................................... 438/763; 438/493
(58) Field of Search ................................. 438/763, 493, 438/503, 507, 648; 427/255.31; 430/5

(56) References Cited

U.S. PATENT DOCUMENTS

| | | | |
|---|---|---|---|
| 6,200,893 B1 * | 3/2001 | Sneh | 438/685 |
| 6,248,640 B1 | 6/2001 | Nam | |
| 6,284,646 B1 * | 9/2001 | Leem | 438/629 |
| 6,287,965 B1 | 9/2001 | Kang et al. | |
| 6,392,792 B1 | 5/2002 | Naulleau | |
| 6,396,900 B1 * | 5/2002 | Barbee et al. | 378/84 |
| 2002/0028556 A1 | 3/2002 | Marsh et al. | |

OTHER PUBLICATIONS

George, "Atomic Layer Deposition of Al$_2$O$_3$/ZnO Nanolaminates & Alloys," Presented Dec. 20, 2001 at Lawrence Livermore National Laboratory in Livermore, CA., 35 pgs.

* cited by examiner

Primary Examiner—Kamand Cuneo
Assistant Examiner—Lisa Kilday
(74) Attorney, Agent, or Firm—James L. Clingan, Jr.; Kim-Marie Vo

(57) ABSTRACT

A extreme ultraviolet (EUV) mask blank having a reflective stack formed by depositing repeated periods of a silicon layer, a first barrier layer, a molybdenum layer, and a second barrier layer using atomic layer deposition is discussed. Precursors using silane and hydrogen are used to form the silicon layer. The first and second barrier layers are preferably different thicknesses of the same material and can be formed using precursors including diborane and methane. In one embodiment, the molybdenum layer is formed using precursors including hydrogen and molybdenum pentachloride or molybdenum pentaiodide. An EUV mask used to pattern a photoresist layer to form an integrated circuit is manufactured from the EUV mask blank.

26 Claims, 2 Drawing Sheets

METHOD OF MAKING AN INTEGRATED CIRCUIT USING AN EUV MASK FORMED BY ATOMIC LAYER DEPOSITION

FIELD OF THE INVENTION

This invention relates to methods for making integrated circuits and more particularly to methods for making integrated circuits using EUV lithography and reflective masks.

BACKGROUND OF THE INVENTION

In making integrated circuits it is desirable to improve the lithography by using shorter and shorter wavelengths for exposing photoresist on semiconductor wafers. These shorter wavelengths allow for higher resolution and require special masks for achieving that higher resolution. One of the techniques that is being developed for high volume manufacturing is using extreme ultraviolet (EUV) frequencies, which have very short wavelengths. Wavelengths from 4 to 25 nanometers (nm) are considered EUV. This technology generally requires a reflective mask, as distinct from a transmission mask, because materials useful as mask materials tend to have high absorption at EUV wavelengths. EUV light is reflected off of the mask and exposes the photoresist according to the pattern of mask. In making the mask, there is first an EUV blank having multi-layer stack on a substrate. The multi-layer stack is reflective. An absorber portion is formed and patterned over the reflective portion to leave a reflective pattern underneath. The reflective pattern is what is actually exposed on the photoresist. In making these masks, the features that are ultimately reflected onto the integrated circuit are extremely fine features. Accordingly, the mask must be extremely high quality and only provide the desired pattern.

One of the difficulties has been having a multi-layer stack in the blank that provides a high degree of reflection at the desired frequency. One of the difficulties has been that the individual layers that make up the multi-layer stack are not of the correct thickness with the result that the frequency that is reflected is not be the desired frequency. The result is a reduction in the amount of light energy that reaches the portions of photoresist on the wafer that are to be exposed. Reduced energy for exposure lower the exposure throughput. Another difficulty is that the layers are not of sufficiently uniform thickness resulting in different frequencies being reflected at different spatial locations on the mask. Non-uniform exposure of the wafer pattern results in non-uniform pattern fidelity or linewidth. This non-uniform pattern fidelity results in integrated circuits having low performance or that are defective.

Accordingly, there is a need for a mask blank that has a multi-layer stack with more accuracy and more uniform thickness.

BRIEF DESCRIPTION OF THE DRAWINGS

The present invention is illustrated by way of example and not by limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DESCRIPTION OF THE INVENTION

In one embodiment atomic layer deposition (ALD) is used to form a multi-layer stack, which is reflective, for an EUV mask blank. The mask blank thus has a high quality reflective portion due to the layers of the multi-layer stack having a high degree of uniformity and at the desired thickness within a very small tolerance. The EUV mask blank is used to make a mask, which in turn is used to make an integrated circuit.

Figure 1:
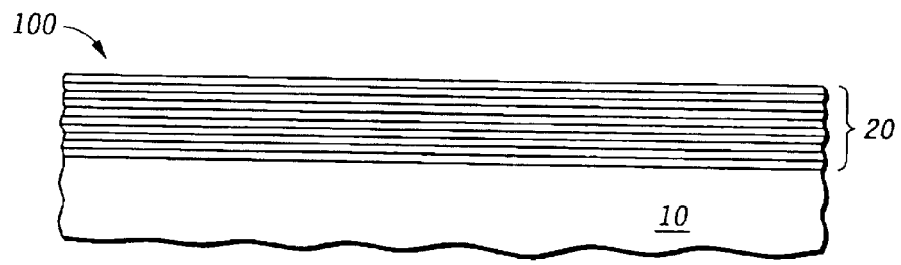
FIG. 1 shows a cross section of an EUV mask blank according to an embodiment of the invention.

Shown in FIG. 1 is a mask 100 comprising a substrate 10 having an overlying reflective layer 20, also called the multi-layer stack. Reflective layer 20 comprises a plurality of alternating silicon and molybdenum layers with a barrier in between each layer of silicon and molybdenum. In current practice the number of layers is 40 of each silicon and molybdenum. There are thus also 80 barrier layers. This can be viewed as 40 periods, wherein each period comprises two barrier layers, a silicon layer, and a molybdenum layer. These layers are chosen to provide high reflectivity of incident EUV wavelength of 13.4 nm. This wavelength is what is used on currently available equipment. The thicknesses of these layers would be altered according to changes that may occur in the particular wavelength of the EUV light that is used.

A close approximation for the thickness of the period is:

$$\frac{\lambda \cos(\theta)}{2[d_{Mo} n_{Mo} + (1 - d_{Mo})]}$$

where $\lambda$ is the wavelength of the incident light, $\theta$ is the angle of incidence to the extent of deviation from the perpendicular to the surface, $d_{Mo}$ is the fraction of the period comprised by the molybdenum layer, and $n_{Mo}$ is the refractive index of the molybdenum. A rule of thumb is that the thickness of the molybdenum layer should be 40% of the period so that $d_{Mo}$ becomes 0.4. After solving for the period this way, the barrier and silicon thicknesses are chosen experimentally. This barrier is chosen to be only as thick as necessary to prevent intermixing of the silicon and molybdenum. The silicon then is the remaining portion of the desired thickness.

The silicon layer should preferably be chosen to be thickness in the range of 15 to 35 Angstroms. The molybdenum layer is preferably chosen to be a particular thickness in the range of 15 to 30 Angstroms. The barrier layers, although one may be a little different from the other, are preferably in the range of 10 to 25 Angstroms.

Figure 2:
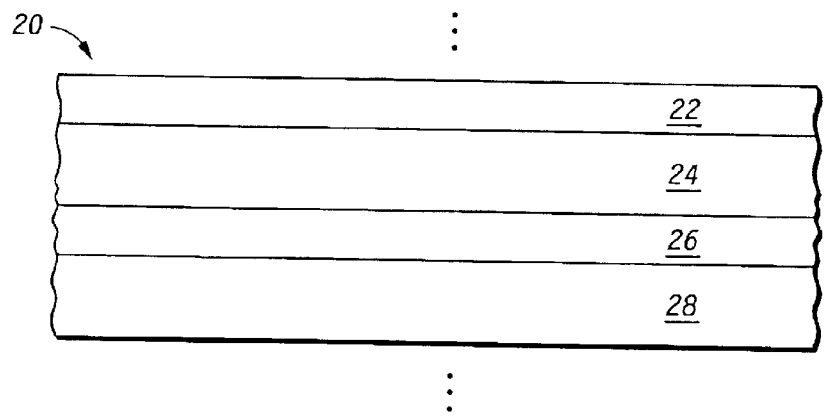
FIG. 2 shows a portion of the EUV mask blank of FIG. 1 in more detail.

Shown in FIG. 2 is a portion of reflective layer 20 comprising a barrier layer 22; a silicon layer 24 under barrier layer 22, a barrier layer 26 under silicon layer 24, and a molybdenum layer 28 under barrier layer 26. Each of layers 22–28 is deposited using ALD to achieve a high degree of accuracy for the thickness of these layers. Barrier layers 22 and 26 are boron carbide. They are formed by using precursors diborane and methane. As an alternative, they may also use diborane in combination with pentane, hexane, ethane, propane, and octane.

For example with regard to barrier layer 22, first a single layer of diborane is formed over the underlying silicon layer 24 using ALD. A nitrogen purge is performed to remove unreacted diborane. Subsequently, methane is flowed over this single layer of diborane to cause a reaction that results in boron carbide. Another nitrogen purge is performed to remove unreacted methane. These steps are repeated until the desired thickness is reached. All of the barrier layers that are on a silicon layer are desirably the same thickness.

Silicon layer 24 is formed by depositing a single layer of silane on barrier 26 using ALD. A nitrogen purge removes unreacted silane. This is followed by flowing hydrogen over the silane to result in leaving a single silicon layer. A nitrogen purge is then performed to remove the unreacted hydrogen. Similarly these steps are repeated until the desired thickness is reached. All of the silicon layers are desirably the same thickness.

Barrier layer 26 is formed by forming a single layer of diborane over the underlying molybdenum layer using ALD. A nitrogen purge is performed to remove unreacted diborane. Subsequently, methane is flowed over this single layer of diborane to cause a reaction that results in boron carbide. Another nitrogen purge is performed to remove unreacted methane. These steps are repeated until the desired thickness is reached. All of the barrier layers that are on a molybdenum layer are desirably the same thickness.

Molybdenum layer 28 is formed by depositing a single layer of molybdenum pentachloride on an underlying barrier layer (not shown in FIG. 2) using ALD. A nitrogen purge removes unreacted molybdenum pentachloride. This is followed by flowing hydrogen over the molybdenum pentachloride to result in leaving a single molybdenum layer. A nitrogen purge is then performed to remove the unreacted hydrogen. Similarly these steps are repeated until the desired thickness is reached. As an alternative to molybdenum pentachloride, molybdenum pentaiodide may be used as the first precursor. All of the molybdenum layers are desirably the same thickness.

The layers on EUV mask blank 100 thus have a high degree of thickness uniformity over each period (one of each of the two barrier layers, the silicon layer, and the molybdenum layer) because each layer thickness within the period is very accurate due to using ALD and the choice of materials. The barrier layers 22 and 26 prevent the molybdenum and silicon layers from intermixing. If these layers intermix, the reflectivity is reduced. Intermixing can occur at relatively low temperatures such as 150 degrees Celsius. Thus, these barrier layers are very significant. The use of silane or disilane in the formation of the silicon layer is particularly advantageous because it permits low temperature deposition. Disilane will provide for the lowest deposition temperature between the two, but the deposition rate is also greater and thus harder to control. Silane provides a compromise in low temperature and deposition rate slow enough to be most easily controlled for ultra thin silicon films. Dichlorosilane can also be for depositing silicon using chemical vapor deposition but requires the significant disadvantage of a higher temperature than either silane or disilane. Also silane that meets semiconductor manufacturing requirements is readily available and is thus a relatively low cost solution in the formation of precision silicon layers. By using ALD and the preferred precursors described above, the temperatures for all depositions need not exceed 500 degrees Celsius. Organic silicon precursors can be used for lowering deposition temperature.

Figure 3:
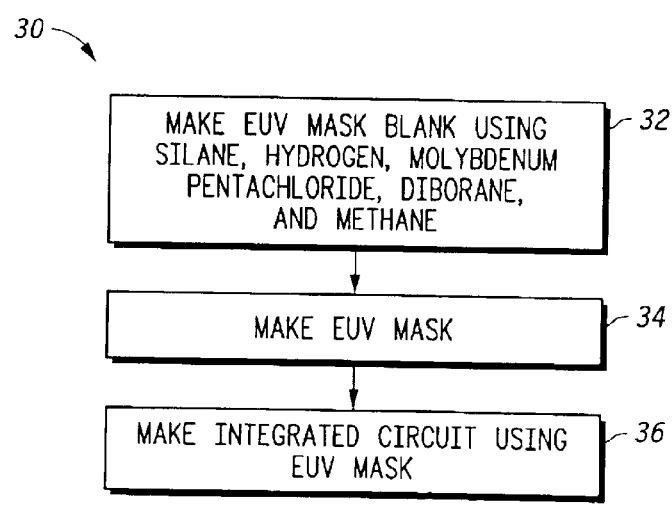
FIG. 3 is a flow diagram according the preferred embodiment of the invention.

Shown in FIG. 3 is a flow diagram 30 comprising steps 32, 34 and 36. Step 32 comprises forming the EUV mask blank by forming reflective layer 20 as described above. Step 34 comprises making an EUV mask using EUV mask blank 100 having reflective layer 20. This mask is obtained by forming absorbing portions on EUV mask blank 100. These absorbing portions are carefully formed so as to achieve the desired pattern of exposed reflective layer 20. The absorbing portions desirably have an anti-reflective coating (ARC) on them. Step 36 comprises making an integrated circuit using the EUV mask formed in step 34.

Figure 4:
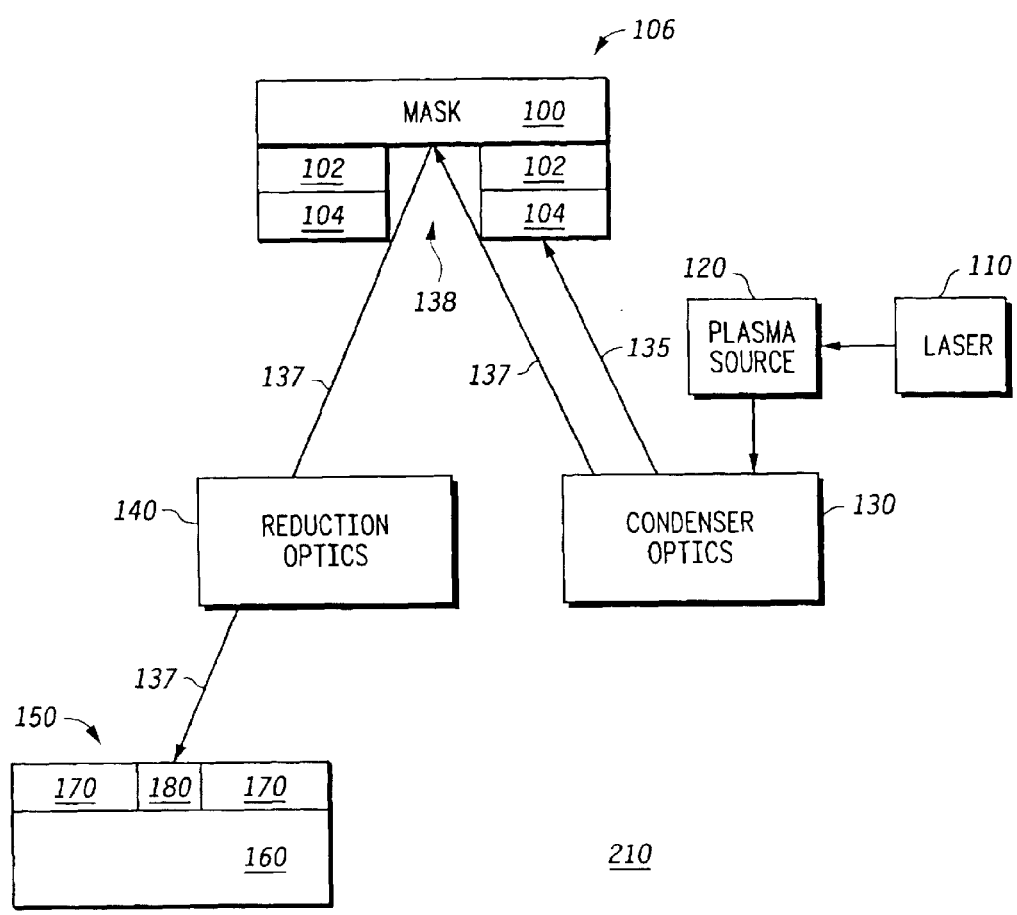
FIG. 4 shows an apparatus for making an integrated circuit using the EUV mask blank of FIG. 1.

Shown in FIG. 4 is an apparatus 210 comprising the EUV mask blank 100 with patterned absorber layer 102 and patterned ARC layer 104 formed thereon to form a mask 106, a laser 110, a plasma source 120, condenser optics 130, reduction optics 140, and a semiconductor wafer 150 having many integrated circuits to be patterned. Laser 110 provides a source to energize the plasma source 120. Plasma source 120 provides the EUV that is transmitted to the condenser optics 130. Condenser optics 130 illuminates mask 106 that reflects the EUV according to the pattern on mask 106. The reflected EUV passes through reduction optics 140 and is imaged onto wafer 150. Wafer 150 has a substrate 160 that has at least a layer of semiconductor material on it. Over this substrate 160 is a photoresist layer having an exposed portion 180 and an unexposed portion 170. Exposed portion 180 corresponds to a region 138 shown with respect to mask 100. Regions 170 correspond to the areas where absorber layer 102 and ARC layer 104 are present. Mask 106 is simplified in all the drawings to show a very small number of features to aid the explanation of the invention. In an actual mask, there would typically be millions, even billions, of features on a mask. The number is steadily increasing.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of making a reflective mask useful for transferring a pattern to a semiconductor substrate using extreme ultraviolet (EUV) radiation, the method comprising:

providing a mask substrate; and forming a reflective stack over the mask substrate comprising:

depositing a silicon layer over the mask substrate using atomic layer deposition;

depositing a barrier layer over the silicon layer using atomic layer deposition; and depositing a molybdenum layer over the barrier layer using atomic layer deposition, wherein the barrier layer is approximately 10 to 25 Angstroms in thickness.

2. The method of claim 1, wherein the silicon layer is approximately 15 to 35 Angstroms in thickness.

3. The method of claim 1, wherein the molybdenum layer is approximately 13 to 30 Angstroms in thickness.

4. The method of claim 1, wherein the barrier layer comprises boron carbide.

5. The method of claim 1, wherein depositing the silicon layer over the mask substrate using atomic layer deposition further comprises using a precursor comprising silane.

6. The method of claim 5, wherein the precursor further comprises hydrogen.

7. The method of claim 1, wherein depositing the barrier layer over the silicon layer using atomic layer deposition further comprises using a precursor comprising diborane.

8. The method of claim 7, wherein the precursor further comprises a chemical selected from the group consisting of methane, pentane, hexane, ethane, propane, and octane.

9. The method of claim 1, wherein depositing the molybdenum layer over the barrier layer using atomic layer deposition further comprises using a precursor comprising a chemistry selected from the group consisting of molybdenum pentachloride and molybdenum pentaiodide.

10. The method of claim 9, the molybdenum precursor further comprises hydrogen.

11. The method or claim 1, wherein depositing the silicon layer over the mask substrate using atomic layer deposition, depositing the barrier layer over the silicon layer using atomic layer deposition, and depositing a molybdenum layer over the barrier layer using atomic layer deposition are performed at temperatures less than approximately 500 degrees Celsius.

12. A method of making a reflective mask useful for transferring a pattern to a semiconductor substrate using extreme ultraviolet (EUV) radiation, the method comprising:
providing a mask substrate;
depositing a silicon layer over the mask substrate using silane and hydrogen;
depositing a barrier layer over the silicon layer using a barrier layer precursor comprising diborane; and
depositing a molybdenum layer over the barrier layer, wherein the barrier layer is approximately 10 to 25 Angstroms in thickness.

13. The method of claim 12 wherein the barrier layer precursor further comprises a chemical selected from the group consisting of methane, pentane, hexane, ethane, propane, and octane.

14. The method of claim 12, wherein the molybdenum layer is formed using a molybdenum precursor comprising a chemistry selected from the group consisting of molybdenum pentachloride and molybdenum pentaiodide.

15. The method of claim 14, the molybdenum precursor further comprises hydrogen.

16. The method of claim 12, wherein depositing the silicon layer, depositing the barrier layer, and depositing the molybdenum layer are performed using atomic layer deposition.

17. The method of claim 12, wherein the barrier layer comprises boron carbide.

18. The method of claim 12, wherein the silicon layer is approximately 15 to 35 Angstroms in thickness.

19. The method of claim 12, wherein the molybdenum layer is approximately 15 to 30 Angstroms in thickness.

20. The method of claim 12, wherein depositing a silicon layer, depositing the barrier layer, and depositing the molybdenum layer are performed at temperatures less than approximately 500 degrees Celsius.

21. A method of forming an integrated circuit using extreme ultraviolet (EUV) radiation comprising:
providing an EUV mask blank comprising:
a mask substrate; and
a reflective stack formed by a method comprising:
depositing a silicon layer over the mask substrate using atomic layer deposition;
depositing a barrier layer over the silicon layer using atomic layer deposition; and
depositing a molybdenum layer over the barrier layer using atomic layer deposition;
forming an EUV mask using the EUV mask blank, wherein the EUV mask has a pattern: providing a semiconductor wafer;
forming a photoresist layer over the semiconductor wafer;
providing an incident light to the EUV mask;
reflecting the incident light off of the EUV mask; and
forming the pattern from the EUV mask in the photoresist layer.

22. The method of claim 21, wherein:
depositing the silicon layer over the mask substrate using atomic layer deposition further comprises using silicon precursors comprising silane and hydrogen; and
depositing a barrier layer over the silicon layer using atomic layer deposition further comprises using a barrier precursor comprising diborane.

23. The method of claim 21, wherein depositing a molybdenum layer over the barrier layer using atomic layer deposition further comprises using a precursor comprising a chemistry selected from the group consisting of molybdenum pentachloride and molybdenum pentaiodide.

24. A method at forming an integrated circuit using extreme ultraviolet (EUV) radiation comprising:
providing a mask substrate;
(1) depositing a silicon layer over the mask substrate using atomic layer deposition with silane and hydrogen precursors;
(2) depositing a first barrier layer over the silicon layer using atomic layer deposition; and
(3) depositing a molybdenum layer over the barrier layer using atomic layer deposition;
(4) depositing a second barrier layer over the molybdenum layer using atomic layer deposition;
repeating steps 1–4 until a reflective layer of a desired thickness is achieved;
depositing a patterned absorbing layer over the reflective layer to provide an exposed pattern of the reflective layer;
providing a semiconductor wafer,
forming a photoresist layer over the semiconductor wafer;
providing an incident light to the exposed pattern of the reflective layer;
reflecting the incident light off of the exposed pattern of the reflective layer; and
forming the exposed pattern of the reflective layer in the photoresist layer.

25. The method of claim 24, wherein the first barrier layer is approximately 10 to 25 Angstroms in thickness.

26. The method of claim 21, wherein the first barrier layer is approximately 10 to 25 Angstroms in thickness.

* * * * *

UNITED STATES PATENT AND TRADEMARK OFFICE
CERTIFICATE OF CORRECTION

PATENT NO.     : 6,835,671 B2                                               Page 1 of 1
DATED          : December 28, 2004
INVENTOR(S)    : Scott Daniel Hector et al.

It is certified that error appears in the above-identified patent and that said Letters Patent is hereby corrected as shown below:

<u>Column 5,</u>
Line 6, change "13" to -- 15 --.

Signed and Sealed this

Fourth Day of April, 2006

JON W. DUDAS
*Director of the United States Patent and Trademark Office*